(12) United States Patent
Kon

(10) Patent No.: US 8,421,334 B2
(45) Date of Patent: Apr. 16, 2013

(54) SURFACE LIGHT-EMITTING DEVICE

(75) Inventor: Shusaku Kon, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 0 days.

(21) Appl. No.: 12/818,405

(22) Filed: Jun. 18, 2010

(65) Prior Publication Data

US 2011/0031873 A1 Feb. 10, 2011

(30) Foreign Application Priority Data

Aug. 4, 2009 (JP) ................. 2009-181489

(51) Int. Cl.
*H01J 1/62* (2006.01)

(52) U.S. Cl.
USPC ............ 313/498; 315/169.1; 315/169.3; 257/40; 445/24

(58) Field of Classification Search .......... 313/498–512; 257/40, 72, 98–100, 642–643, 759
See application file for complete search history.

(56) References Cited

U.S. PATENT DOCUMENTS

| 2006/0127679 A1* | 6/2006 | Gulati et al. | 428/426 |
| 2006/0175625 A1* | 8/2006 | Yokotani et al. | 257/95 |
| 2008/0093978 A1* | 4/2008 | Mori | 313/498 |
| 2008/0278650 A1* | 11/2008 | Kajiwara et al. | 349/42 |
| 2009/0073688 A1* | 3/2009 | Patrick | 362/232 |
| 2011/0025198 A1 | 2/2011 | Kon | |

FOREIGN PATENT DOCUMENTS

| EP | 2280434 A2 | 2/2011 |
| JP | 2008243669 A | 10/2008 |
| JP | 2009070744 A | 4/2009 |

OTHER PUBLICATIONS

European search report for EP10169770.4 dated Dec. 10, 2012.
D'Andrade B Wet Al: "Organic light-emitting device luminaire for illumination applications", Applied Physics Letters, AIP, American Institute of Physics, Melville, NY, US, vol. 88, Jan. 1, 2006, pp. 192908.1-192908.3.

* cited by examiner

*Primary Examiner* — Tracie Y Green

(57) ABSTRACT

A surface light-emitting element radiates light emitted to a side of a surface light-emitting device. The surface light-emitting device includes: a polygonal transparent substrate, and a light-emitting element disposed on one face of the transparent substrate. The light-emitting element is a laminated body including a transparent electrode which is positively charged and functions as an anode, a negative electrode which becomes negatively charged and functions as a cathode opposite the transparent electrode, and a light-emitting layer between the transparent electrode and a negative electrode. Lengths of respective sides and a thickness of the transparent substrate have a relationship that if b denotes the thickness of transparent substrate, dividing the lengths of the respective sides by 4b results in values ranging from 0.5 (inclusive) to 10 (inclusive).

6 Claims, 2 Drawing Sheets

SURFACE LIGHT-EMITTING DEVICE

This application is based upon and claims the benefit of priority from Japanese patent application No. 2009-181489, filed on Aug. 4, 2009, the disclosure of which is incorporated herein in its entirety by reference.

BACKGROUND OF THE INVENTION

1. Field of the Invention

The present invention is related to a surface light-emitting device using a surface light-emitting element, in particular, an EL (Electro-Luminescence) element.

2. Description of the Related Art

In recent years, in addition to LED (Light Emitting Diode) elements, EL (Electro-Luminescence) elements that are surface light-emitting elements, have become popular as new light-emitters.

Surface light-emitting devices using EL elements are already being commercialized in the forms of a backlight of a mobile phone, an audio player, or the like, or as a small-sized display. In addition, EL displays using EL elements are being studied and commercialized as thin, large-size displays that may potentially replace liquid crystal displays and plasma displays.

In addition, a light emitted by an EL element has a wide emission spectrum and is therefore close to natural light. Consequently, a surface light-emitting device using an EL element is also suitable as a light fixture.

In a surface light-emitting device, an EL element is provided on a transparent substrate. An EL element is configured such that a transparent electrode (anode) with optical transparency, a light-emitting layer, and a metal electrode (cathode) are laminated in order.

Generally, only approximately 20% of light emitted at an EL element is emitted to the outside. The remaining 80% is not emitted to the outside and is not used. A specific breakdown of unused light is as follows. Approximately 20% of the emitted light becomes trapped inside the transparent substrate and 40 to 50% becomes trapped inside the light-emitting layer. The remaining 10 to 20% is absorbed by the metal electrode or the like.

Light becomes trapped in the transparent substrate because a significant difference between the refractive index of the transparent substrate and the refractive index of a medium outside of the surface light-emitting device such as air causes light radiated from the EL element to be reflected instead of being radiated to the outside of the transparent substrate. In consideration thereof, as an example of related art, there is a method of reducing reflection of light and increasing light to be radiated to the outside of a surface light-emitting device by providing a layer having an intermediate refractive index between the refractive index of a transparent substrate and the refractive index of a medium outside of the surface light-emitting device on a surface of the transparent substrate on which an EL element is not provided (Japanese Patent Laid-Open No. 2005-327689).

When a light-emitting device having an LED element is used as a light fixture, the light fixture is particularly well suited as a downlight or a spotlight due to the strong directionality of the LED element. On the other hand, when a surface light-emitting device having an EL element that is a surface light-emitting element is used as a light fixture, the light fixture is particularly well suited to illuminate a certain wide range such as a ceiling light because the directionality of the EL element is not as strong as an LED element. However, while the directionality of the EL element is not as strong as an LED element, the EL element has a near-Lambertian luminous intensity distribution. When a surface light-emitting device having an EL element is used as a light fixture, not too much light is radiated from the side of the light fixture. Therefore, when the light fixture having an EL element is attached to the ceiling of a room and used as a main lighting, the upper part of the room becomes dark. A person feels that a room is bright when the entire room is well lit. Therefore, a light fixture having an EL element and that is used attached to the ceiling of a room has a problem in that the light fixture is unable to evoke a sense of brightness in a person that corresponds to the amount of light actually being radiated to the outside from the light fixture. Accordingly, radiating of light emitted by an EL element to the side of a surface light-emitting device is required. However, while methods disclosed in Japanese Patent Laid-Open No. 2005-327698 and the like are capable of efficiently radiating light emitted at an EL element from a flat surface of a transparent substrate or, in other words, from the front of a surface light-emitting device, the methods have difficulty radiating light to the side of the surface light-emitting device.

SUMMARY OF THE INVENTION

An object of the present invention is to provide a surface light-emitting element and a surface light-emitting device using the same which solve the problem in which it is difficult to radiate light emitted by the surface light-emitting element to the side of the surface light-emitting device.

A surface light-emitting device according to the present invention includes: a polygonal transparent substrate; and a light-emitting element that is a laminated body including a transparent electrode which is positively charged and function as an anode, a negative electrode which is negatively charged and function as a cathode opposite the transparent electrode, and a light-emitting layer sandwiched between the transparent electrode and the negative electrode, the light-emitting element disposed on one surface of the transparent substrate. In addition, lengths of respective sides and the thickness of the transparent substrate have a relationship such that if b denotes the thickness of the transparent substrate, then dividing the lengths of the respective sides by 4b results in values ranging from 0.5 (inclusive) to 10 (inclusive).

The above and other objects, features and advantages of the present invention will become apparent from the following description with reference to the accompanying drawings which illustrate examples of the present invention.

DETAILED DESCRIPTION OF THE EXEMPLARY EMBODIMENTS

Hereinafter, an exemplary embodiment of the present invention will be described with reference to the attached drawings. Components having like functions will be assigned like numerals in the attached drawings and descriptions thereof may be omitted.

Figure 1:
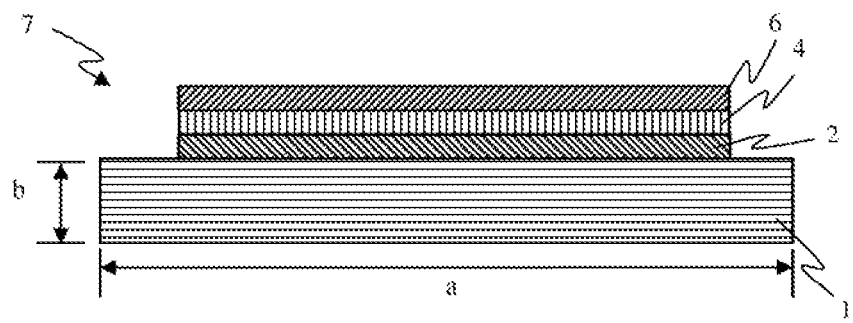
FIG. 1 is a schematic configuration diagram of an exemplary embodiment of a surface light-emitting device including a surface light-emitting element according to the present invention.

FIG. 1 is a schematic configuration diagram of an exemplary embodiment of a surface light-emitting device including a surface light-emitting element according to the present invention.

The surface light-emitting device according to the present invention includes transparent substrate 1 and EL element 7. EL element 7 that is a light-emitting element is constituted by a laminated body in which transparent electrode (anode) 2, light-emitting layer 4, and metal electrode (cathode) 6 are laminated in order on one of the surfaces of transparent substrate 1. The surface light-emitting device according to the present invention causes light of light-emitting layer 4 to be outputted from transparent substrate 1.

Transparent substrate 1 is made of, for example, glass. Transparent electrode 2 which is positively charged and function as an anode is made of, for example, ITO (Indium Tin Oxide) that has a high optical transparency. Metal electrode 6 which is negatively charged and function as a cathode is primarily made of aluminum. Light-emitting layer 4 is an EL (Electro-Luminescence) layer made of an organic material.

An emission principle of EL element 7 will now be described. A hole generated at transparent electrode 2 is transported to light-emitting layer 4. Meanwhile, an electron generated at metal electrode 6 is transported to light-emitting layer 4. The hole sent from transparent electrode 2 and the electron sent from metal electrode 6 are bound to each other in light-emitting layer 4, and light emission occurs due to the energy generated by the binding. The emitted light passes through transparent substrate 1 and is primarily radiated to the outside from a flat surface of transparent substrate 1.

When the surface light-emitting device is used as a light fixture or the like, as described above, light emitted by EL element 7 is desirably radiated not only from a flat surface of transparent substrate 1 or, in other words, from the front of the surface light-emitting device, but also from the side of the surface light-emitting device.

The present inventors contemplated that light emitted by EL element 7 is primarily radiated from the flat surface of transparent substrate 1 due to the fact that transparent substrate 1 is thin. Therefore, it was contemplated that by giving transparent substrate 1 an appropriate thickness to increase the area of the side faces of transparent substrate 1, light from EL element 7 can also be radiated from the side faces of transparent substrate 1 and light can be radiated to the side of the surface light-emitting device.

Figure 2:
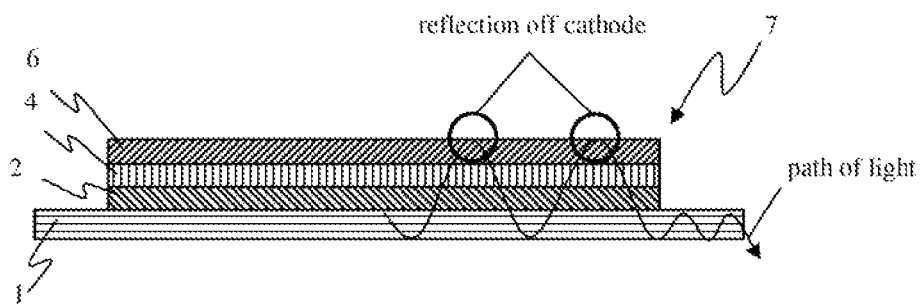
FIG. 2 is a diagram illustrating a path of light radiated from an EL element when the transparent substrate is thin.
Figure 3:
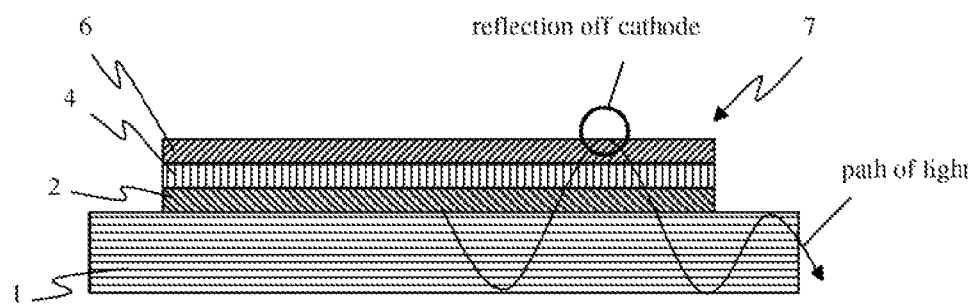
FIG. 3 is a diagram illustrating a path of light radiated from an EL element when the transparent substrate is thick.

Accordingly, in the present invention, the area of the side faces of transparent substrate 1 is increased or, in other words, the thickness of transparent substrate 1 is increased. FIGS. 2 and 3 illustrate examples of how light from EL element 7 is emitted to the outside from transparent substrate 1. FIG. 2 illustrates a case where transparent substrate 1 is thin while FIG. 3 illustrates a case where transparent substrate 1 is thick.

As illustrated in FIG. 2, when transparent substrate 1 is thin, a part of the light radiated from EL element 7 proceeds, while being repeatedly reflected between transparent substrate 1 and metal electrode 6, and is radiated from a side face of transparent substrate 1. As illustrated in FIG. 3, when transparent substrate 1 is thick, a part of the light radiated from EL element 7 proceeds, while being repeatedly reflected a smaller number of times between transparent substrate 1 and metal electrode 6 as compared to the case where transparent substrate 1 is thin, and is radiated from a side face of transparent substrate 1. Since metal electrode 6 has light-absorbing properties, light absorption occurs every time light is reflected by metal electrode 6, thereby reducing light intensity. Therefore, by increasing the thickness of transparent substrate 1, the number of reflections of light can be reduced and a drop in light intensity can be suppressed.

In addition, in the present invention, since increasing the thickness of transparent substrate 1 increases the mechanical strength of transparent substrate 1, damage is less likely to occur when transporting the surface light-emitting device or the like.

Experiments repeatedly performed by the present inventors based on such observations revealed that when transparent substrate 1 is a square, by satisfying $0.5 \leq a/4b \leq 10$, where a denotes a length of one side and b denotes thickness, light is radiated to the outside not only from the flat surface of transparent substrate 1 but also from the side faces thereof and a luminous intensity distribution suitable for using of the surface light-emitting device that has a surface light-emitting element according to the present invention as a light fixture is achieved.

Figure 4:
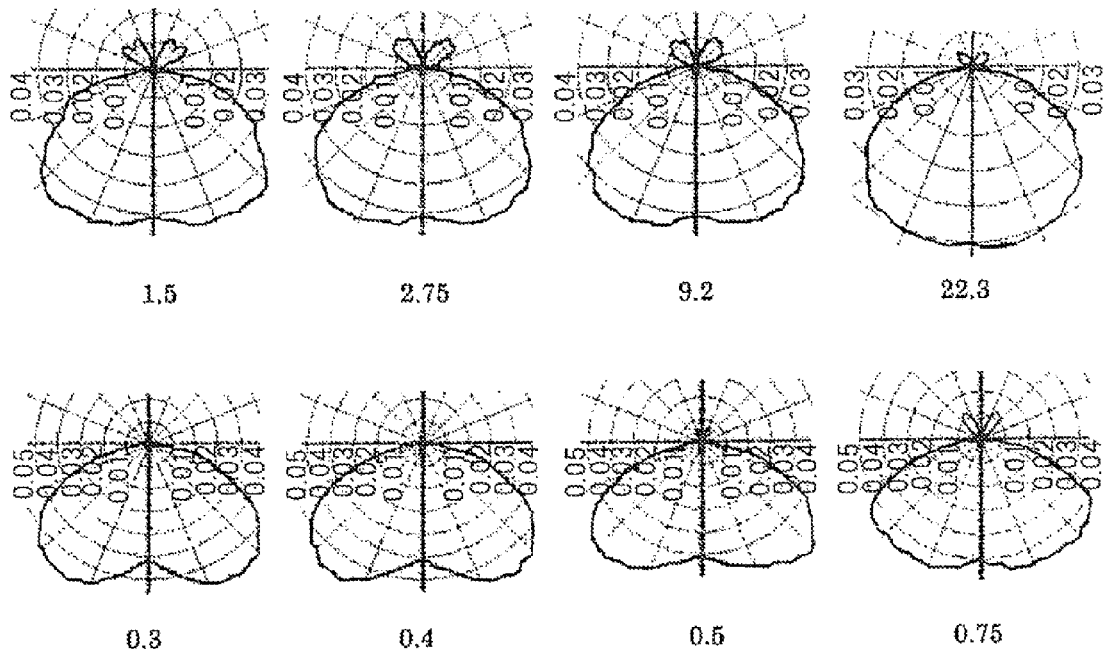
FIG. 4 is a diagram illustrating luminous intensity distributions of light of a surface light-emitting device as calculated by a simulation according to a ray tracing method when a thickness and a length of a transparent substrate are varied.

FIG. 4 is a diagram illustrating luminous intensity distributions of light of a surface light-emitting device as calculated by a simulation according to a ray tracing method when the thickness and length of square transparent substrate 1 are varied. A horizontal axis direction indicates luminous intensity in a horizontal direction of transparent substrate 1, and a vertical axis direction indicates luminous intensity in a vertical direction of transparent substrate 1. Concentric circles inscribed at equal intervals indicate relative intensity, where one scale interval is 0.01. In addition, eight luminous intensity distributions of the surface light-emitting device corresponding to values of a/4b of 0.3, 0.4, 0.5, 0.75, 1.5, 2.75, 9.2, and 22.3 are presented.

The diagram shows that when a/4b ranges from 0.3 to 0.4, light radiated in a range of around 25 degrees to around 45 degrees from a vertical direction with respect to transparent substrate 1 is stronger than light radiated in the vertical direction with respect to transparent substrate 1.

The diagram also shows that when a/4b ranges from 0.5 to 9.2, light is radiated at an approximately even intensity in a range of 45 degrees or greater from the vertical direction with respect to transparent substrate 1.

The diagram further shows that when a/4b equals 22.3, while light radiated at around 34 degrees from the vertical direction with respect to transparent substrate 1 is strong, the intensity of radiated light decreases abruptly in a range greater than around 34 degrees.

From the above, when $a/4b<0.5$, light intensity is greater in a horizontal direction with respect to transparent substrate 1 or, in other words, to the side of transparent substrate 1 as compared to light intensity in a vertical direction with respect to transparent substrate 1 or, in other words, to the front of transparent substrate 1. In this case, when the surface light-emitting device is used as a main lighting, an upper part of a room becomes well lit, thereby evoking a sense that a central part of the room is dark. Therefore, the use of a surface light-emitting device where $a/4b<0.5$, as a main lighting, is not particularly favorable. In addition, when $a/4b \geq 22.3$, since light intensity in a vertical direction with respect to transparent substrate 1 or, in other words, to the front of transparent substrate 1 is high and since light intensity in a horizontal direction or, in other words, to the side is low, the upper part of the room cannot be illuminated brightly when the surface light-emitting device is used as main lighting. Therefore, taking into consideration the luminous intensity distributions illustrated in FIG. 4, by satisfying $0.5 \leq a/4b \leq 10$, where a denotes the length of one side of transparent substrate 1 and b denotes the thickness thereof, light with sufficient intensity can also be radiated to the side of the surface light-emitting device without reducing the intensity of light radiated towards the front of the surface light-emitting device. In addition, when the existence of a range in which increased thickness of transparent substrate 1 resulting in improved light extraction efficiency, is also taken into consideration, the range of $0.5 \leq a/4b \leq 5$ is more favorable.

While the relationship expressed as $0.5 \leq a/4b \leq 10$ can be satisfied by one transparent substrate 1, the relationship expressed as $0.5 \leq a/4b \leq 10$ can alternatively be satisfied by a laminated body that is formed of a lamination of a plurality of thin transparent boards in an optical-contacting state.

When transparent substrate 1 is not a square and is, for example, a rectangle, if a' denotes the length of a long side, a" denotes the length of a short side, and b denotes thickness, then two relationships expressed as $0.5 \leq a'/4b \leq 10$ and $0.5 \leq a''/4b \leq 10$ should be satisfied. In other words, in the case of a polygon, all relationships that result in values ranging from 0.5 (inclusive) to 10 (inclusive) when the respective sides are divided by 4b should to be satisfied. In addition, when transparent substrate 1 is a circle, if c denotes a diameter and b denotes thickness, then $0.5 \leq c/4b \leq 10$ should be satisfied. In the case of a ellipsoid, if d denotes the length of a long axis, d' denotes the length of a short axis, and b denotes thickness, then two relationships expressed as $0.5 \leq d/4b \leq 10$ and $0.5 \leq d'/4b \leq 10$ should be satisfied.

In addition to glass described above, acryl, polycarbonate, polyethylene terephthalate (PET), and the like may be used as transparent substrate 1.

Figure 5:
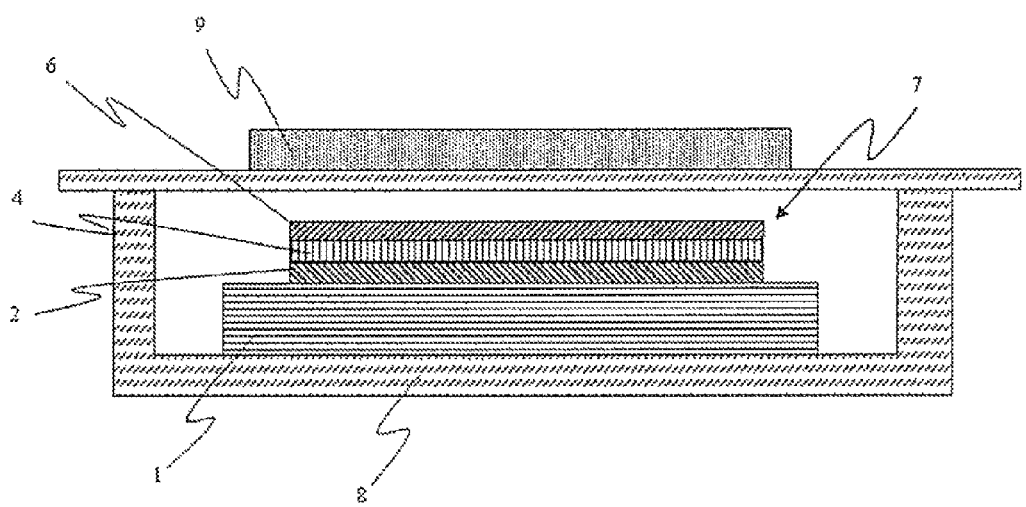
FIG. 5 is a schematic diagram of an example of using of a surface light-emitting device according to the present invention as a light fixture.

As illustrated in FIG. 5, the surface light-emitting device according to the present invention can be arranged as an easy-to-use light fixture by bringing chassis 8 into optical contact with transparent substrate 1 provided with EL element 7 and integrating chassis 8 with power source 9 having a converter circuit, an inverter circuit, and a lighting circuit.

According to the present invention, since light emitted by a surface light-emitting element can be radiated to the side of a transparent substrate, the intensity of light radiated not only to the front of a surface light-emitting device but also to the side thereof can be increased.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The whole or part of the exemplary embodiments disclosed above can be described as, but not limited to, the following supplementary notes.

(Supplementary note 1) A surface light-emitting device comprising:
  a polygonal transparent substrate; and
  a light-emitting element that is a laminated body including
    a transparent electrode which is positively charged and function as an anode, a negative electrode which is negatively charged and function as a cathode opposite the transparent electrode, and a light-emitting layer sandwiched between the transparent electrode and the negative electrode, the light-emitting element disposed on one surface of the transparent substrate, wherein
  lengths of respective sides and a thickness of the transparent substrate have a relationship such that if b denotes the thickness of the transparent substrate, then dividing the lengths of the respective sides by 4b results in values ranging from 0.5 (inclusive) to 10 (inclusive).

(Supplementary note 2) The surface light-emitting device according to supplementary note 1, wherein the lengths of the respective sides and the thickness of the transparent substrate have a relationship such that if b denotes the thickness of the transparent substrate, then dividing the lengths of the respective sides by 4b results in values ranging from 0.5 (inclusive) to 5 (inclusive).

(Supplementary note 3) A surface light-emitting device comprising:
  a circular transparent substrate; and
  a light-emitting element that is a laminated body including
    a transparent electrode which is positively charged and function as an anode, a negative electrode which is negatively charged and function as a cathode opposite the transparent electrode, and a light-emitting layer sandwiched between the transparent electrode and the negative electrode, the light-emitting element disposed on one surface of the transparent substrate, wherein
  a diameter and a thickness of the transparent substrate has a relationship such that if b denotes the thickness of the transparent substrate, then dividing the diameter by 4b results in a value ranging from 0.5 (inclusive) to 10 (inclusive).

(Supplementary note 4) The surface light-emitting device according to supplementary note 3, wherein the diameter and the thickness of the transparent substrate has a relationship such that if b denotes the thickness of the transparent substrate, then dividing the diameter by 4b results in a value ranging from 0.5 (inclusive) to 5 (inclusive).

(Supplementary note 5) A surface light-emitting device comprising:
  an ellipsoidal transparent substrate; and
  a light-emitting element that is a laminated body including
    an ellipsoidal transparent electrode which is positively charged and function as an anode, a negative electrode which is negatively charged and function as a cathode opposite the transparent electrode, and a light-emitting layer sandwiched between the transparent electrode and the negative electrode, the light-emitting element disposed on one surface of the transparent substrate, wherein
  a long axis, a short axis, and a thickness of the transparent substrate have a relationship such that if b denotes the thickness of the transparent substrate, then dividing the long axis by 4b results in a value ranging from 0.5 (inclusive) to 10 (inclusive) and dividing the short axis by 4b results in a value ranging from 0.5 (inclusive) to 10 (inclusive).

(Supplementary note 6) The surface light-emitting device according to supplementary note 5, wherein the length of the long axis, the length of the short axis, and the thickness of the transparent substrate have a relationship such that if b denotes the thickness of the transparent substrate, then dividing the long axis by 4b results in a value ranging from 0.5 (inclusive) to 5 (inclusive) and dividing the short axis by 4b results in a value ranging from 0.5 (inclusive) to 5 (inclusive).

(Supplementary note 7) The surface light-emitting device according to any one of supplementary notes 1 to 6, wherein the transparent substrate is formed of a lamination of thin transparent boards by optical contacting.

(Supplementary note 8) The surface light-emitting device according to any one of supplementary notes 1 to 7, wherein the transparent substrate is made of glass, acryl, polycarbonate, or polyethylene terephthalate.

(Supplementary note 9) A light fixture, wherein the surface light-emitting device according to any one of supplementary notes 1 to 8 is provided inside a chassis, the surface light-emitting device is in optical contact with an inner face of the chassis, and a power source is provided in the chassis.

(Supplementary note 10) The light fixture according to supplementary note 9, wherein an inverter circuit, a converter circuit, and a lighting circuit are provided in the power source.

(Supplementary note 11) A light radiation method, comprising steps of:
 binding a hole from a transparent electrode, that is positively charged and function as an anode, and that is laminated on a thickened transparent substrate, with an electron from a negative electrode that is negatively charged to become a cathode opposite the transparent electrode, inside a light-emitting layer sandwiched between the transparent electrode and the negative electrode;
 emitting light using energy of the binding; and
 radiating the light from the light-emitting layer to the outside from a flat surface of the transparent substrate such that the number of reflections of the light at the negative electrode from the transparent substrate up to radiation of the light is reduced by increasing a horizontal direction travel distance with respect to the transparent substrate of light reflected by the transparent substrate until the light is reflected by the negative electrode so as to radiate high intensity light from the side face of the transparent substrate.

(Supplementary note 12) The light radiation method according to supplementary note 11, using, as the transparent substrate, a polygonal transparent substrate, in which the lengths of the respective sides and the thickness of the respective sides have a relationship such that if b denotes the thickness, then dividing the lengths of the respective sides by 4b results in values ranging from 0.5 (inclusive) to 10 (inclusive) so as to cause light from the light-emitting layer to be radiated to the outside from the flat surface of the transparent substrate and light reflected in the transparent substrate to be radiated to the outside from the side face of the transparent substrate.

(Supplementary note 13) The light radiation method according to supplementary note 12, wherein a polygonal transparent substrate, in which the lengths of the respective sides and the thickness of the respective sides have a relationship such that if b denotes the thickness, then dividing the lengths of the respective sides by 4b results in values ranging from 0.5 (inclusive) to 5 (inclusive), is used as the transparent substrate.

(Supplementary note 14) The light radiation method according to supplementary note 11, using, as the transparent substrate, a circular transparent substrate whose diameter and thickness have a relationship such that if b denotes the thickness, then dividing the diameter by 4b results in a value ranging from 0.5 (inclusive) to 10 (inclusive) so as to cause light from the light-emitting layer to be radiated to the outside from the flat surface of the transparent substrate and light reflected in the transparent substrate to be radiated to the outside from the side face of the transparent substrate.

(Supplementary note 15) The light radiation method according to supplementary note 14, wherein a circular transparent substrate, whose diameter and thickness have a relationship such that if b denotes the thickness, then dividing the diameter by 4b results in a value ranging from 0.5 (inclusive) to 5 (inclusive), is used as the transparent substrate.

(Supplementary note 16) The light radiation method according to supplementary note 11, using, as the transparent substrate, an ellipsoidal transparent substrate, in which the length of a long axis, the length of a short axis, and the thickness of the transparent substrate have a relationship such that if b denotes the thickness of the transparent substrate, then dividing the long axis by 4b results in a value ranging from 0.5 (inclusive) to 10 (inclusive) and dividing the short axis by 4b results in a value ranging from 0.5 (inclusive) to 10 (inclusive) so as to cause light from the light-emitting layer to be radiated to the outside from the flat surface of the transparent substrate and light reflected in the transparent substrate to be radiated to the outside from the side face of the transparent substrate.

(Supplementary note 17) The light radiation method according to supplementary note 16, using, as the transparent substrate, an ellipsoidal transparent substrate, in which the length of a long axis, the length of a short axis, and the thickness have a relationship such that if b denotes the thickness of the transparent substrate, then dividing the long axis by 4b results in a value ranging from 0.5 (inclusive) to 5 (inclusive) and dividing the short axis by 4b results in a value ranging from 0.5 (inclusive) to 5 (inclusive).

What is claimed is:

1. A surface light-emitting device comprising:
 a polygonal transparent substrate; and
 a light-emitting element that is a laminated body including a transparent electrode which is positively charged and function as an anode, a negative electrode which is negatively charged and function as a cathode opposite the transparent electrode, and a light-emitting layer sandwiched between the transparent electrode and the negative electrode, the light-emitting element disposed on one surface of the transparent substrate, wherein
 lengths of respective sides and a thickness of the transparent substrate have a relationship such that when b denotes the thickness of the transparent substrate, then dividing the lengths of the respective sides by 4b results in values ranging from 0.5 (inclusive) to 10 (inclusive).

2. The surface light-emitting device according to claim 1, wherein the lengths of the respective sides and the thickness of the transparent substrate have a relationship such that if b denotes the thickness of the transparent substrate, then dividing the lengths of the respective sides by 4b results in values ranging from 0.5 (inclusive) to 5 (inclusive).

3. The surface light-emitting device according to claim 1, wherein the transparent substrate is formed of a lamination of thin transparent boards by optical contacting.

4. The surface light-emitting device according to claim 1, wherein the transparent substrate is made of glass, acryl, polycarbonate, or polyethylene terephthalate.

5. A light fixture, wherein the surface light-emitting device according to claim 1 is provided inside a chassis, the surface light-emitting device is in optical contact with an inner face of the chassis, and a power source is provided in the chassis.

6. The light fixture according to claim 5, wherein an inverter circuit, a converter circuit, and a lighting circuit are provided in the power source.

\* \* \* \* \*